(12) United States Patent
Nakayama

(10) Patent No.: US 6,995,948 B2
(45) Date of Patent: Feb. 7, 2006

(54) THIN-FILM MAGNETIC HEAD, METHOD FOR PRODUCING THE SAME AND MAGNETIC DISK DEVICE USING THE SAME

(75) Inventor: Masatoshi Nakayama, Tokyo (JP)

(73) Assignee: TDK Corporation, Tokyo (JP)

( * ) Notice: Subject to any disclaimer, the term of this patent is extended or adjusted under 35 U.S.C. 154(b) by 258 days.

(21) Appl. No.: 10/617,560

(22) Filed: Jul. 11, 2003

(65) Prior Publication Data

US 2004/0052004 A1 Mar. 18, 2004

(30) Foreign Application Priority Data

Jul. 11, 2002 (JP) .............................. 2002-202379

(51) Int. Cl.
 *G11B 5/255* (2006.01)
(52) U.S. Cl. .................................................... 360/122
(58) Field of Classification Search ...................... None
 See application file for complete search history.

(56) References Cited

U.S. PATENT DOCUMENTS

| | | | | |
|---|---|---|---|---|
| 4,225,892 A | * | 9/1980 | Bassett et al. ............... | 360/313 |
| 5,175,658 A | | 12/1992 | Chang et al. ................ | 360/103 |
| 5,475,552 A | * | 12/1995 | Nasu et al. .................. | 360/122 |
| 5,560,097 A | * | 10/1996 | Bajhorek et al. ......... | 29/603.12 |
| 5,636,092 A | * | 6/1997 | Nasu et al. .................. | 360/122 |

FOREIGN PATENT DOCUMENTS

| | | | |
|---|---|---|---|
| JP | 59174508 A | 10/1984 | |
| JP | 62145646 A | 6/1987 | |

(Continued)

OTHER PUBLICATIONS

New Diamond, Japan New Diamond Forum 11, Oct. 1988, vol. 4, No. 4, pp. 14-17.

(Continued)

*Primary Examiner*—Robert S. Tupper
(74) *Attorney, Agent, or Firm*—Marshall, Gerstein & Borun LLP

(57) ABSTRACT

A magnetoresistive thin-film magnetic head with high corrosion resistance for recording medium having massive capacity is provided by providing a protective film having a thickness of 40 Å or less. Since the distance between the head and the medium is remarkably reduced, the film is suitable for a recording medium having high-packing density. The magnetoresistive type thin-film magnetic head is provided, wherein the following layers are formed on at least the surface of the head facing a recording medium: (A) a lower layer composed of a thin film having the composition represented by the formula selected from the group consisting of:
formula (i): $SiC_xH_yO_zN_wF_TB_UP_V$ (where X=0.5–26, Y=0.5–13, Z=0–6, W=0–6, T=0–6, U=0–1 and V=0–1, in terms of atomic ratio), and formula (ii): $SiH_yO_zN_wF_TB_UP_V$ (where Y=0.0001–0.7, Z=0–6, W=0–6, T=0–6, U=0–1 and V=0–1); and (B) an upper layer composed of a diamond-like thin film having the composition represented by the following formula: $CH_aO_bN_cF_dB_eP_f$ (where a=0–0.7, b=0–1, c=0–1, d=0–1, e=0–1 and f=0–1), and the total thickness of the lower layer and the upper layer is 40 Å or less. Also provided are a method for producing the same, and a magnetic head device using the same.

5 Claims, 3 Drawing Sheets

U.S. PATENT DOCUMENTS

| | | | |
|---|---|---|---|
| 5,654,850 A * | 8/1997 | Ganapathi et al. | 360/235.2 |
| 5,734,519 A * | 3/1998 | Fontana et al. | 360/97.01 |
| 5,864,452 A * | 1/1999 | Hirano et al. | 360/122 |
| 5,896,253 A * | 4/1999 | Dirne et al. | 360/122 |
| 5,930,077 A * | 7/1999 | Obata et al. | 360/235.1 |
| 5,948,532 A * | 9/1999 | Hwang et al. | 428/408 |
| 6,586,069 B2 * | 7/2003 | Dykes et al. | 428/833.2 |
| 6,879,470 B2 * | 4/2005 | Johnson et al. | 360/317 |

FOREIGN PATENT DOCUMENTS

| | | | |
|---|---|---|---|
| JP | 62145647 A | 6/1987 | |
| JP | 4-41672 A | 2/1992 | |
| JP | 4-276367 | 10/1992 | |
| JP | 2571957 | 10/1996 | |
| JP | 10275308 A | 10/1998 | |
| JP | 10289419 A | 10/1998 | |

OTHER PUBLICATIONS

"Bias Effect on the Formulation of Carbon Films by RF-Plasma CVD", Nakayama et al., Journal of Ceramic Society of Japan Int. Edition, vol. 98, 1990, pp. 597-600.

* cited by examiner

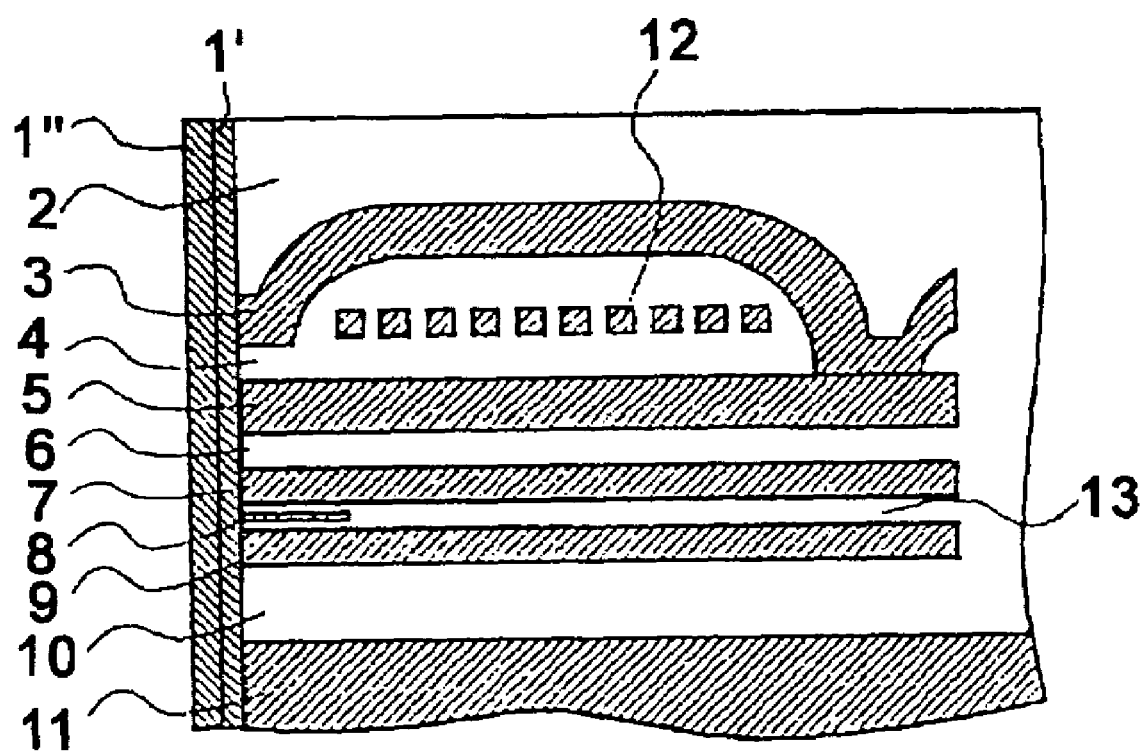
F I G. 1

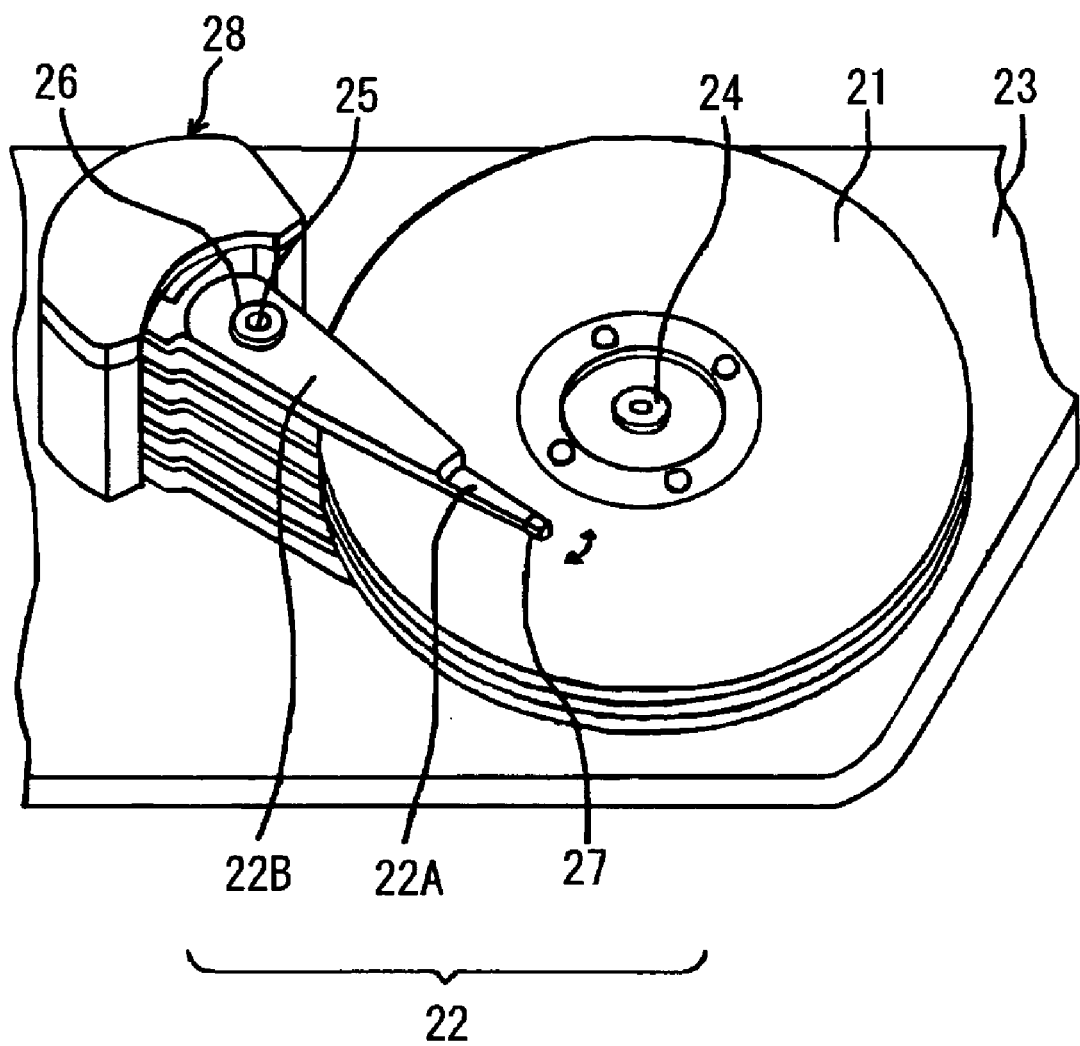
F I G. 2

THIN-FILM MAGNETIC HEAD, METHOD FOR PRODUCING THE SAME AND MAGNETIC DISK DEVICE USING THE SAME

BACKGROUND OF THE INVENTION

The present invention relates to a thin-film magnetic head, a method for producing the same and a magnetic disk device having a slider using the same, and particularly, to a thin-film magnetic head using a magnetoresistive film, for example, of MR (Magnetoresistive) type, GMR (Grand Magnetoresistive), TMP (Tunneling Junction Magnetoresistive) type, and CCP (Current Perpendicular in Plane) type, and a method for producing the same, and a magnetic disk device having slider using the same.

PRIOR ART

In the field of magnetic recording, demands for higher density have been increased and development has been made to meet such demands. As the higher density has been attained, several types of head for hard disk have been studied and developed, such as a thin-film magnetic head in which magnetic poles, coils and the like are filmed on the substrate by thin-film deposition method, and an MR induction type combined head in which recording is performed by an induction type head and reproduction is conducted utilizing a magnetoresistance effect.

An MR head is a device that reads an external magnetic signal by utilizing the change in resistance at the reading sensor portion using a magnetic material. In the case of the MR head, reproduction output relies on the magnetic signal of the recording medium but not on the relative velocity to the recording medium. Therefore, higher output can be obtained even in the case of the magnetic recording of high linear packing density. In the case of the MR head, a magnetoresistive film (MR film) is generally sandwiched by a pair of magnetic shield films, which is called shield type MR head, in order to increase resolving power and to obtain excellent radiofrequency properties. In this case, the MR head is just a reproduction head, and therefore, an MR induction type combined head, in which an induction type head portion for recording is integrated with the MR head portion, is used.

Typically, with respect to the thin-film magnetic head, CSS (Contact Start Stop) type is adopted in which the thin-film magnetic head is floated above the recording medium by a bearing effect of air. The head is generally held at a minute distance (about 0.2–2.0 $\mu$m) above the magnetic disc rotating at a high speed. Therefore, surface strength and abrasion resistance, which provide tolerance to head crash and CSS abrasion, are important. Various studies have been made to improve abrasion resistance, such as one disclosed in Japanese Patent Application Kokai No. 4-276,367, in which a protective film is formed on a rail of a magnetic head slider. This protective film consists of a silicon adhesive layer and a hydrogen-containing amorphous carbon film, having the overall thickness of 250 Å or less. However, the film exhibits poor strength since silicon is used in the adhesive layer. In addition, when such a silicon adhesive layer is applied to the magnetic thin-film magnetic head structure consisting of a sintered substrate made of alumina and titanium carbide, an alumina insulation layer, a thin film made of soft magnetic material (e.g. permalloy, Sendust, iron nitride and the like) and the like, coherence or adhesiveness between the thin-film magnetic head and the protective film becomes poor, leading to problems such as peeling of the film and insufficient abrasion resistance.

Japanese Patent No. 2,571,957 discloses that a buffer layer consisting of amorphous silicon and amorphous silicon carbide is formed on the surface of an oxide, and then a film of carbon or film mainly composed of carbon is further formed thereon. However, even though the protective layer with the buffer layer is applied to the thin-film magnetic head, sufficient corrosion resistance and abrasion resistance cannot be attained. In addition, it has disadvantages in that the extra step is required to form the buffer layer other than the step to form the protective film, leading to longer production period and higher production cost. Moreover, the buffer layer makes the film thicker, which opposes the demands on the magnetic head for hard disk, such as cost-effectiveness, mass-productivity, and larger packing density.

In the general method for forming a silicon interlayer used in industry, silicon atoms are just sputtered and chemical bonds are not formed between silicon atoms. The resultant layer has low hardness and poor denseness, leading to the formation of masses of silicon atoms. Therefore, when the protective film is made thinner, sufficient corrosion resistance and abrasion resistance (CSS) cannot be attained. In other words, when a thin diamond-like carbon film is formed on the surface of the silicon buffer layer by sputtering method, chemical bonds are not formed between silicon atoms, resulting in poor denseness of the silicon interlayer and formation of fine masses, and the diamond-like carbon film merely covers the silicon interlayer. Therefore, when the diamond-like carbon film is formed thinner, corrosive gases such as moisture easily penetrate through the silicon interlayer and then corrode the layer, and also the diamond-like protective film may peel off In addition, there arises another problem that the metal on the side of the thin-film magnetic head is corroded and dispersed in the silicon, which changes the electric resistance, which in turn degrades the properties of the thin-film magnetic head.

On the other hand, the present inventors proposed in Japanese Patent Application Kokai Nos. 10-289419 and 10-275308 a protective film for thin-film magnetic head, exhibiting strong coherence to the components of the thin-film magnetic head, excellent corrosion resistance and excellent abrasion resistance. Specifically, for example in Japanese Patent Application Kokai No. 10-275308, a thin-film magnetic head exhibiting excellent durability is provided, which has a protective film represented by the formula: $SiC_XH_YO_ZN_W$ (each of X, Y, Z and W is represented in terms of atomic ratio, where X=3–26, Y=0.5–13, Z=0.5–6 and W=0–6). However, it was found that this method also had a problem explained below. The problem to be solved by the invention Today, a recording medium having a massive capacity, such as a disc having a capacity of up to 80 Gpsi, is widely used. In the case of magnetic recording with such a massive capacity, it is necessary to reduce the distance between the head and the recording medium in order to obtain high packing density. However, when a thick protective film is present on the head, more distance is provided due to this thickness, and thus such a film is not suitable for higher density media.

The protective film disclosed in the above-mentioned Japanese Patent Application Kokai No. 10-275308 has a thickness of approximately 70 Å. When the thickness is above this value, sufficient corrosion resistance and abrasion resistance can be obtained. On the other hand, in order to attain higher density, the protective film should be formed as thin as possible, so as to reduce the distance. However, when the thickness is below the value, sufficient corrosion resistance cannot be obtained (the reason is believed that it contains Si), and it is not appropriate to make the protective film thinner.

SUMMARY OF THE INVENTION

The present invention provides a magnetoresistive type thin-film magnetic head, wherein the following protective layers are formed on at least the surface of the head contacting to a recording medium:

(A) a lower layer, in which atoms are chemically bonded to each other, exhibiting high hardness and high denseness and having the composition represented by the formula selected from the group consisting of:

formula (i): $SiC_XH_YO_ZN_WF_TB_UP_V$ where X=0.5–26, Y=0.5–13, Z=0–6, W=0–6, T=0–6, U=0–1 and V=0–1, and formula(ii): $SiH_YO_ZN_WF_TB_UP_V$ where Y=0.0001–0.7, Z=0–6, W=0–6, T=0–6, U=0–1 and V=0–1; and (B) an upper layer composed of a diamond-like thin film having the composition represented by the following formula: $CH_aO_bN_cF_dB_eP_f$ where a=0–0.7, b=0–1, c=0–1, d=0–1, e=0–1 and f=0–1.

With this structure, it becomes possible to attain an overall film thickness of 40 Å or less, or even 30 Å or less, which is much thinner than the conventional minimum thickness of 70 Å, while maintaining high corrosion resistance and abrasion resistance.

It is preferred that the lower layer be formed using negative bias-applied vapor deposition methods (CVD methods), such as plasma CVD method and ionization vapor deposition method. The protective film having the desired properties in the present invention cannot be attained by sputtering method. This is because bulk mass of silicon is formed by sputtering, and may spoil the thin-film magnetic head.

On the other hand, for forming the upper layer, sputtering method can be used, in addition to negative bias-applied vapor deposition methods (CVD methods), such as plasma CVD method and ionization vapor deposition method.

The lower layer protective film containing silicon used in the present invention differs from the conventional silicon buffer layer, and the atoms in the film can form strong chemical bonds therebetween, thereby making the film dense and chemically stable. In addition, chemical bonds can be formed between the lower layer protective film and the upper layer protective film. As a result, it is possible to make the thickness of the upper layer protective film (the diamond-like carbon film) 40 Å or less, which is much thinner than that of the conventional film, while the film still prevents the penetration of corrosive gases such as moisture, and exhibits excellent corrosion resistance and excellent abrasion resistance.

Since the thus formed protective film can be made to have a thickness of 40 Å or even 30 Å or less, while exhibiting excellent corrosion resistance and excellent abrasion resistance, the present invention has advantages in that the distance between the MR thin-film magnetic head and the medium can be reduced, which is suitable for high-density recording. In addition, even when the film is made to have such a small thickness, the thin-film magnetic head exhibits almost the same level of corrosion resistance and abrasion resistance as those of the head having the thick protective film of 70 Å disclosed in Japanese Patent Application Kokai No. 10-275308.

BRIEF DESCRIPTION OF THE DRAWINGS

[FIG. 1]

FIG. 1 shows a cross-section of the MR thin-film magnetic head of the present invention.

[FIG. 2]

FIG. 2 shows a perspective view of the magnetic disk device having a slide where the MR thin-film magnetic head of the present invention is used.

FIG. 3 shows an enlarged perspective view of the slider portion having the thin-film magnetic head shown in FIG. 2.

REFERRED EMBODIMENT OF THE INVENTION

Figure 3:
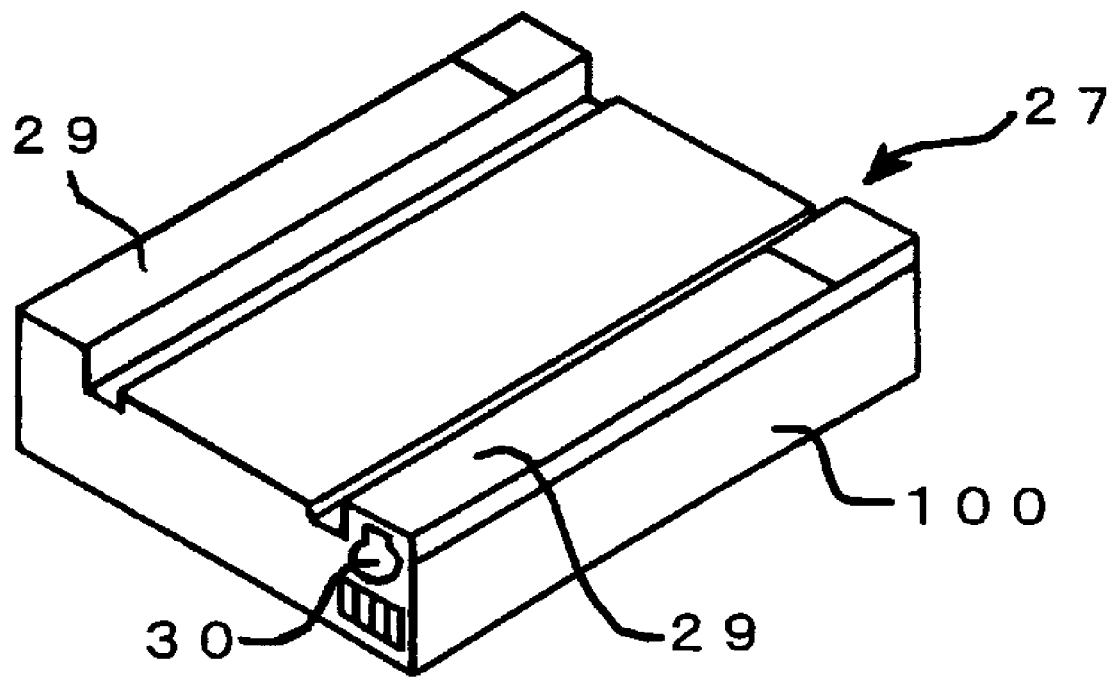
[FIG. 3]

In the present invention, the protective film composed of a lower layer and an upper layer made of an amorphous diamond-like carbon film, in a predetermined composition ratio respectively, is formed on at least the surface of the thin-film magnetic head facing a recording medium (i.e. floating surface). This protective film can be formed by applying a DC bias voltage or self-bias to a thin-film magnetic head, and by conducting vapor deposition methods such as plasma CVD method and ionization vapor deposition method.

Lower Layer Protective Film

The composition of the material to be used in the lower layer of the protective film is represented by the following formula:

(i) $SiC_XH_YO_ZN_WF_TB_UP_V$

In the formula above, $SiC_XH_Y$ is essential, and the other components are used arbitrarily, where X=0.5–26, Y=0.5–13, Z=0–6, W=0–6, T=0–6, U=0–1 and V=0–1. Among them, conditions in which X=1–8 and Y=0.8–4 are preferred.

Alternatively, the composition represented by the following formula can be used as the material for the lower layer of the protective film:

(ii) $SiH_YO_ZN_WF_TB_UP_V$

In the formula, $SiH_Y$ is essential, and the other components are used arbitrarily, where Y=0.0001–0.7, Z=0–6, W=0–6, T=0–6, U=0–1 and V=0–1. Among them, conditions in which Y=0.01–0.2 is preferred.

In the formula (i) above, when X is below 0.5, the film has poor strength. On the other hand, when X is above 26, the internal stress becomes large, and the coherence becomes weak. When Y is below 0.5, the film has poor strength. When Y is above 13, the film also shows poor strength. When each of Z, W and T is above 6, the film density and the abrasion resistance become low.

The lower layer satisfying such conditions is in the state of amorphous, and the thickness is 20 Å or less, preferably 5–15 Å. When the thickness is below 5 Å, adhesiveness becomes low, and thus the effect of the present invention becomes low. When the thickness is above 20 Å, the upper layer (diamond-like thin film) becomes too thinner. When the overall thickness (with the upper layer) is above 40 Å, the distance between the head and the recording medium becomes large, and thus the properties become deteriorated.

In general, the Vickers hardness Hv of the lower layer is approximately 600–400, and the index of refraction at the wave length of 632 nm is approximately 1.5–2.8.

Upper Layer Protective Film

The composition of the amorphous diamond-like thin film to be used for the upper layer of the protective film is represented by the following formula:

where C is essential, and a=0–0.7, b=0–1, c=0–1, d=0–1, e=0–1 and f=0–1, in terms of atomic ratio.

The film formed by vapor deposition methods such as plasma CVD method, ionization vapor deposition method and ECR plasma CVD method, in which hydrocarbon is used as material, generally contains H with a=0.05–0.7. However, it is possible to obtain the upper layer that does not contain hydrogen, by forming a diamond-like thin film by follow cathode method (FCVA), sputtering method and the like where carbon is used as a target.

Diamond-like carbon (DLC) film is sometimes referred to as "diamond carbon film," "i-carbon film" and the like. With respect to the diamond-like carbon film, reference can be made to, for example, Japanese Patent Application Kokai Nos. 62-145646 and 62-145647, and New Diamond Forum, Vol. 4 No. 4 (issued in Oct. 25, 1988). As is described in the above-mentioned document (New Diamond Forum), Raman spectroscopic analysis showed that the DLC film has a broad peak of Raman scattering spectrum at 1400–1700 cm$^{-1}$, which is different from diamond having a narrow peak at 1333 cm$^{-1}$, and graphite having a narrow peak at 1581 cm$^{-1}$, which in turn suggests that the DLC film has distinctively different structure from graphite and diamond. The broad peak observed in Raman spectroscopic analysis spectrum of the DLC film is subject to change, due to the change in the elements included, other than carbon and hydrogen. The DLC film is an amorphous thin film mainly composed of carbon atoms and hydrogen atoms, in which carbon atoms are randomly bonded via sp2 and sp3 bonds.

In the present invention, the thickness of the DLC film is typically 15 Å or more, preferably 15–25 Å, and when it forms the protective layer together with the lower layer, the overall thickness can be approximately 40 Å or less. When the layer is thicker, the distance between the MR thin-film magnetic head and the recording medium becomes large, even though the protective layer exhibits sufficient corrosion resistance and abrasion resistance. Therefore, such thickness is not preferred for the thin-film magnetic head used for high-density recording.

In the present invention, the excellent protective film can be obtained by providing a protective film having a double layer structure composed of the specific lower layer and the specific upper layer. The reason for the excellent properties is believed that the lower layer in the present invention having the composition represented by the formula (i) or (ii) is served as a highly-cohesive layer to the substrate (thin-film magnetic head) and equally to the upper layer (DLC film), since the lower layer contains Si. In addition, since the lower layer also contains Si—C chemical bond, Si—Si chemical bond and/or C—C chemical bond, it has dense bridged structure in the same manner as the DLC film does, contributing to prevention from the penetration of corrosive gases. The lower layer also has a hardness (Hv) of approximately 2000–6000, which is the same level as that of the DLC film of the upper layer, contributing to abrasion resistance (CSS).

The thin-film magnetic head of the present invention will be explained below. FIG. 1 shows a schematic cross section of one embodiment of the thin-film magnetic head of the present invention. The thin-film magnetic head shown in the drawing has: a complex protective film of the present invention composed of a lower layer 1' and an upper layer 1''; a protective layer 2; an upper magnetic pole layer 3; a gap 4; a lower magnetic pole layer 5; an insulation layer 6; an upper shield layer 7; an MR element 8; a lower shield layer 9; a base layer 10; a substrate 11; a conductive coil 12; and an insulation layer 13. The thin-film magnetic head illustrated in the figure is a so-called MR induction type combined head, having both an MR head portion for reproducing and an induction type head portion for recording. The induction type head portion for recording is composed of the upper magnetic pole layer 3, the lower magnetic pole layer 5, and the gap 4 and the conductive coil 12 sandwiched therebetween. The MR head portion is composed of the upper shield layer 7, the lower shield layer 9, and the insulation layer 13 and the MR element 8 sandwiched therebetween. In the Figure, the induction type head portion locates on the trailing side, and the MR head portion on the leading side. These compositions are known, and reference can be made to, for example, Japanese Patent Application Kokai No. 10-275308.

The thin-film magnetic head unit is formed by laminating these structures, and the lower layer protective film 1' and the upper layer protective film 1'' of the present invention are formed on at least the surface of the unit on which the magnetic recording medium (magnetic disk) runs or with which the medium slides in contact, in other words, on the surface facing the recording medium (in the figure, on the left side of the drawing and on the plane perpendicular to the plane of the paper).

In FIG. 1, the MR induction type combined head is illustrated, and it should be noted that, more sensitive structures, such as GMR (Giant Magnetoresistive) structure, TMR (Tunneling Junction Magnetoresistive) structure and CPP (Current Perpendicular Plane) structure, can be used as well, instead of the MR element 8.

FIG. 2 shows an entire view of the magnetic disk device. A driving portion has a plurality of magnetic head devices supported thereby, and each of the devices has a slider having a thin-film magnetic head, at the front end of the arm portion. FIG. 3 shows a perspective view of the slider having the thin-film magnetic head, and the slider has the MR head on the trailing side (air-outflow end) of the slider.

This embodiment illustrates one type of the magnetic disk device, called CSS (contact start-stop) action type. As shown in FIG. 2, this magnetic disk device has a plurality of magnetic recording media 21, and a plurality of magnetic head devices 22, each of which is associated with the respective magnetic recording medium 21. The magnetic recording medium 21 is to be rotated by the spindle motor 24 fixed to the body 23. The magnetic head device 22 is rotatably fixed to the fixing axis 25 fixed to the body 23 via the bearing 26. In this embodiment, a plurality of the magnetic head devices 22 are fixed to the fixing axis 25 via the same bearing 26, and with this structure, a plurality of the magnetic head devices 22 can be rotated together as one unit. The magnetic head device 22 has a magnetic head slider 27 at the tip thereof The magnetic disk device also has a driving portion 28 at the other end of the magnetic head device 22, which is used for positioning the slider 27 on the track of the magnetic recording medium 21. The driving portion 28 is used for rotating the magnetic head device 22 with the fixing axis 25 as its rotating center, and with this structure, the slider 27 is movable in the radial direction relative to the magnetic recording medium 21.

FIG. 3 shows an enlarged perspective view of the slider shown in FIG. 2. The slider 27 is made of for example, attic ($Al_2O_3.TiC$), and has a substrate 100 in the shape of almost hexahedron as a whole. Among the six surfaces, the surface facing the magnetic recording medium 21 is a recording medium-facing surface or an air bearing surface (ABS) 29. As shown in FIG. 3, on one side of the slider 27 that is perpendicular to the ABS 29, the thin-film magnetic head 30 is formed.

The following is the explanation of the recording-reproducing mechanism using the magnetic disk device having such a structure, with reference to FIG. 2. In the case of the CSS action type, when the magnetic disk device is not operated, i.e. when the spindle motor 24 is not operated and the magnetic recording medium 21 is not rotated, the ABS 29 of the slider 27 and the magnetic recording medium 21 are brought into contact. When recording or reproducing is performed, the magnetic recording medium 21 is rotated at a high speed by the spindle motor 24. This will generate airflow, and in turn generate aerodynamic lift. Utilizing this lift, the slider 27 is lifted up from the surface of the magnetic recording medium 21, and at the same time, the slider is shifted by the driving portion 28 in the horizontal direction relative to the magnetic recording medium 21. During this movement, recording or reproducing is performed by the thin-film magnetic head 30 formed on one surface of the slider 27.

Production of the Lower Layer Protective Film

Next, a method for forming a protective film on at least the surface of the thin-film magnetic head to be protected, i.e. on the surface facing the recording medium, is explained. With respect to the plasma CVD method used in the present invention, reference can be made to, for example, Japanese Patent Application Kokai No. 4-41672. The plasma to be used in plasma CVD method may be either direct current or alternating current, but alternating current is preferred. Alternating current can range from a few hertz to microwave. In addition, ECR plasma described in, for example, "Diamond thin-film technique" (published by Technology Center) can be used.

In the present invention, bias-applied plasma CVD method is preferably used as plasma CVD method. In bias-applied plasma CVD method, a negative bias voltage is applied to the thin-film magnetic head. Detailed description is found in, for example, M. Nakayama et al. Journal of the Ceramic Society of Japan Intnl. Edition Vol. 98, pp 607–609 (1990). Alternatively, self-bias can be utilized instead of applying a bias voltage. When a plasma power source, which is an alternating-current power supply, is connected to the electrode of the device, plasma is generated. This plasma contains electrons, ions and radicals, and is neutral as a whole. However, when the frequency of the plasma power source is audio frequency (AF), radiofrequency (RF) or microwave (MW), the difference in mobility is generated between ions and electrons, and as a result, negative voltage state is generated on the side of the applied electrode (normally the side that is not grounded). This voltage is called a self-bias voltage. The above-mentioned bias voltage is preferably −10−−2000 V, and more preferably −50−−1000 V.

When the lower layer protective film is formed using plasma CVD method, the material gas is preferably selected from the following group of compounds. Examples of the compounds for obtaining the composition of Si+C+H+O include tetramethoxysilane, tetraethoxysilane, octamethylcyclotetrasiloxane, hexamethylcyclosiloxane, hexamethoxydisiloxane, hexaethoxydisiloxane, triethoxyvinylsilane, dimethylethoxyvinylsilane, trimethoxyvinylsilane, methyltrimethoxysilane, dimethoxymethylchlorosilane, dimethoxymethylsilane, trimethoxysilane, dimethylethoxysilane, trimethoxysilanol, hydroxymethyltrimethylsilane, methoxytrimethylsilane, dimethoxydimethylsilane and ethoxytrimethoxysilane. These can be used in combination, or used together with other compounds.

To obtain the composition of Si+C+H+O+N for the lower layer protective film, $N_2$ (as a N source), $NH_3$ and the like (as N+H sources), and compounds of N and O represented by $NO_x$ such as NO, $NO_2$, $N_2O$ (as N+O sources) can be used, in addition to the above-mentioned material gases. Other than those, compounds containing Si+C+H, Si+C+H+O or Si+C+H+N can be used in combination with O sources, ON sources or N sources. As the O sources, $O_2$, $O_3$ and the like can be used, and as the C+H sources, hydrocarbons such as $CH_4$, $C_2H_4$, $C_2H_6$, $C_3H_8$ and $C_5H_6$ can be used.

Examples of the compounds for the lower layer protective film containing Si, C and H include methysilane, dimethylsilane, trimethylsilane, tetramethylsilane, diethylsilane, tetraethylsilane, tetrabutylsilane, dimethyldiethylsilane, tetraphenylsilane, methyltriphenylsilane, dimethyldiphenylsilane, trimethylphenylsilane, trimethylsilyl-trimethylsilane and trimethylsilylmethyl-trimethylsilane. Examples of the compounds containing Si, C, H and N include 3-aminopropyldiethoxymethylsilane, 2-cyanoethyltriethoxysilane, 3-allylaminopropyltrimethoxysilane and 5-(3-aminopropyl)triethoxysilane. These can be used in combination, or used together with silane compounds and hydrocarbons.

In the case of the lower layer protective film composed of Si+H, silane ($SiH_4$) can be used. To include F in the film, $CF_4$, HnFn (n=0–6), $F_2$ and the like can be used; to include P in the film, phosphine ($PH_3$) and the like can be used; and to include B in the film, $BF_3$, $B_2F_6$ and the like can be used.

The flow rate of the above-mentioned material gases can be selected depending on the types of the material gases. In general, it is preferred that the operating pressure be 1.33–6.66 Pa and the input power be 10 W–5 kW.

In the present invention, ionization vapor deposition method and the like can be used for forming the lower layer protective film. With respect to ionization vapor deposition method, reference can be made to, for example, Japanese Patent Application Kokai No. 59-174508. It should be noted that the methods and the devices are not limited to the disclosed ones, and other types of ionization vapor deposition technique can be applied if it is possible to accelerate the material ionized gas for the protective film.

In this case, as one example of the preferred device, rectilinear ion type or deflection ion type device described in Japanese Patent Application Kokai No. 59-174508 can be mentioned. In ionization vapor deposition method, the inside of the vacuum container is kept under the high-vacuum of approximately $1.33 \times 10^{-4}$ Pa. This vacuum container is equipped with a filament therein which generates thermoelectrons when heated by the alternating-current power supply. This filament is sandwiched by an electrode couple, and voltage Vd is applied to the filament. In addition, an electromagnetic coil which generates a magnetic field for capturing ionized gas is placed in such a manner that it surrounds the filament and the electrode couple. The material gas collides with the thermoelectrons from the filament, and generates positive thermolytic ions and electrons. These positive ions are accelerated by negative potential Va applied to the grid. By adjusting Vd, Va and the magnetic field of the coil, the composition and the quality of the film can be altered. In the present invention, Vd=10–500 V and Va=−10—500 V is preferred. In the same manner as mentioned above, a negative bias voltage is used for applying bias to the thin-film magnetic head. The bias voltage is preferably direct current. Alternatively, self-bias can be used instead of the bias voltage. In the same manner as mentioned above, the bias voltage is preferably −10—2000 V, more preferably −50—1000 V When the lower layer protective film is formed by ionization vapor deposition method, the same material gas as in the case of plasma CVD method can be used. The flow rate of the material gas can be selected depending on the type of the gas. In general, the operating pressure is preferably 1.33–6.66 Pa.

Production of the Upper Layer Protective Film

A DLC film used as the upper layer protective film can be formed by, for example, plasma CVD method, ionization vapor deposition method, follow cathode method and ECR plasma CVD method and the like as in the case of the lower layer, and in addition, sputtering method can be used.

With respect to the plasma CVD method used for forming the DLC film, reference can be made to, for example, Japanese Patent Application Kokai No. 4-41672. The plasma to be used in plasma CVD method may be either direct current or alternating current, but alternating current is preferred. Alternating current can range from a few hertz to microwave. In addition, ECR plasma described in, for example, "Diamond thin-film technique" (published by Technology Center) can be used. Moreover, a bias voltage can be applied.

When the DLC film is formed using plasma CVD method, the material gas is preferably selected from the following group of compounds.

Examples of the compounds containing C and H include hydrocarbons such as methane, ethane, propane, butane, pentane, hexane, ethylene and propylene.

Examples of the compounds containing C+H+O include $CH_3OH$, $C_2H_5OH$, HCHO and $CH_3COCH_3$.

Example of the compounds containing C+H+N include ammonium cyanide, hydrogen cyanide, monomethylamine, dimethylamine, allylamine, aniline, diethylamine, acetonitrile, azoisobutane, diallylamine, ethylamine, MMH, DMH, triallylamine, trimethylamine, triethylamine and triphenylamine.

In addition, the above-mentioned compounds can be used in combination, or used together with 0 sources, ON sources, N sources, H sources, F sources, B sources, P sources and the like.

It is also possible to use $O_2$, $O_3$ and the like (as O sources), CO, $CO_2$ and the like (as C+O sources), $H_2$ and the like (as H sources); $H_2O$ and the like (as H+O sources), $N_2$ (as an N source), $NH_3$ and the like (as N+H sources), compound of N and O represented by $NO_x$, such as NO, $NO_2$ and $N_2O$ (as N+O sources), $(CN)_2$ and the like (as N+C sources), $NH_4F$ and the like (as N+H+F sources), and $O_2+F_2$ and the like (as O+F sources).

The flow rate of the above-mentioned material gas can be selected depending on the type of the material gas. In general, it is preferred that the operating pressure be 1–70 Pa and the input power be 10 W–5 kW.

In the present invention, ionization vapor deposition method can be also used for forming the DLC film. With respect to ionization vapor deposition method, reference can be made to, for example, Japanese Patent Application Kokai No. 59-174508. It should be noted that the methods and the devices are not limited to the disclosed ones, and other types of ionization vapor deposition technique can be applied, if it is possible to accelerate the material ionized gas for the protective film. In this case, as one example of the preferred device, rectilinear ion type or deflection ion type device described in Japanese Patent Application Kokai No. 59-174508 can be mentioned.

In ionization vapor deposition method, the inside of the vacuum container is kept under the high-vacuum of approximately $10^{-4}$ Pa. This vacuum container is equipped with a filament therein which generates thermoelectrons when heated by the alternating-current power supply. This filament is sandwiched by an electrode couple, and voltage Vd is applied to the filament. In addition, an electromagnetic coil which generates a magnetic field for capturing ionized gas is placed in such a manner that it surrounds the filament and the electrode couple. The material gas collides with the thermoelectrons from the filament, and generates positive thermolytic ions and electrons. These positive ions are accelerated by negative potential Va applied to the grid. By adjusting Vd, Va and the magnetic field of the coil, the composition and the quality of the film can be altered. In addition, a bias voltage can be applied.

When the DLC film is formed by ionization vapor deposition method, the same material gas as in the case of plasma CVD method can be used. The flow rate of the material gas can be selected depending on the type of the gas. In general, the operating pressure is preferably 1–70 Pa.

It is also possible to form the DLC film by sputtering method. In this case, gases such as $O_2$, $N_2$, $NH_3$, $CH_4$ and $H_2$ as reactive gas can be introduced, in addition to sputtering gases such as Ar and Kr. In addition, C may be used as a target, or a mixed target containing C, N, O and the like or more than two targets may be used. Polymer can be used as a target. With the use of such targets, a radiofrequency power, an alternating current power or a direct current power is applied, thereby sputtering the target; and the sputter is accumulated on the substrate, thereby forming DLC film. The radiofrequency sputter power is generally 50 W–2 kW. In general, the operating pressure is preferably $10^{-3}$–0.1 Pa.

With the use of such targets, the radiofrequency power is applied, thereby sputtering the target, and the sputter is accumulated on the lower layer, thereby forming an upper layer protective film. In this case also, a negative bias voltage is used for applying bias to the substrate or the thin-film magnetic head. The bias voltage is preferably direct current. Alternatively, self-bias can be applied instead of the bias voltage. The bias voltage is preferably −10—2000 V, more preferably −50—1000 V. The radiofrequency sputter power is generally 50 W–2 kW. In general, the operating pressure is preferably $10^{-3}$–0.1 Pa.

EXAMPLES

Examples

Formation of the Protective Film

Formation of a film as the lower layer—method 1 (plasma CVD method) (Sample 1) $Si(CH_3)_4$ and $C_2H_4$ were introduced as material gases for compounds containing Si, C and H, at the flow rates of 8 SCCM and 20 SCCM respectively. RF of 500 W was applied as an alternating current for generating plasma, and the operating pressure of 6.66 Pa and the self-bias of −400 V were applied on the running surface of the MR thin-film magnetic head, thereby forming a film of 5 Å.

(Sample 2) $Si(CH_3)_4$ and $C_2H_4$ were introduced as material gases for compounds containing Si, C and H, at the flow rates of 10 SCCM and 30 SCCM respectively. RF of 500 W was applied as an alternating current for generating plasma, and the operating pressure of 6.66 Pa and the self-bias of −400 V were applied on the running surface of the MR thin-film magnetic head, thereby forming a film of 10 Å.

(Sample 3) $Si(CH_3)_4$ and $C_2H_4$ were introduced as material gases for compounds containing Si, C and H, at the flow rates of 8 SCCM and 20 SCCM respectively. RF of 500 W was applied as an alternating current for generating plasma, and the operating pressure of 6.66 Pa and the self-bias of −400 V were applied on the running surface of the MR thin-film magnetic head, thereby forming a film of 15 Å.

Formation of a film as the lower layer—method 2 (ionization deposition method)

(Sample 4) $Si(OCH_3)_4$ and $CH_4$ were introduced as material gases containing Si+C+H+O, at the flow rates of 5 SCCM and 6 SCCM respectively. The operating pressure of 13.3 Pa, Va=−80 V, Vd=+40 V and the bias of −500 V were applied on the running surface of the MR thin-film magnetic head, thereby forming a film of 5 Å.

(Sample 5) $Si(OCH_3)_4$ was introduced as material gas containing Si+C+H+O at the flow rate of 5 SCCM. The operating pressure of 13.3 Pa, Va=−80 V, Vd=+40 V and the bias of −500 V were applied on the running surface of the MR thin-film magnetic head, thereby forming a film of 10 Å.

(Sample 6) $Si(OC_2H_5)_4$ and $C_2H_4$ were introduced as material gases containing Si+C+H+O, at the flow rates of 5 SCCM and 5 SCCM respectively. The operating pressure of 13.3 Pa, Va=−80 V, Vd=+40 V and the bias of −500 V were applied on the running surface of the MR thin-film magnetic head, thereby forming a film of 10 Å.

(Sample 7) $Si(OC_2H_5)_4$ and $C_2H_4$ were introduced as material gases containing Si+C+H+O, at the flow rates of 5 SCCM and 1 SCCM respectively. The operating pressure of 13.3 Pa, Va=−80 V, Vd=+40 V and the bias of −400 V were applied on the running surface of the MR thin-film magnetic head, thereby forming a film of 15 Å.

Formation of the Upper Layer (DLC)

On the lower layer, a DLC1 film and a DLC2 film were formed by self-bias RF plasma CVD method, under the following conditions.

DLC1
    Material gas: $C_2H_4$ (0.017 $Pa.m^3.s^{-1}$)
    Power source: RF
    Operating pressure: 66.5 Pa
    Input power: 500 W
    Rate of film formation: 100 nm/min
    Film composition: $CH_{0.21}$
    Film thickness: 20–25 Å

DLC2
    Material gas: $C_2H_4$ and $N_2$ (0.085 $Pa.m^3.s^{-1}$)
    Power source: RF
    Operating pressure: 66.5 Pa
    Input power: 500 W
    Rate of film formation: 100 nm/min
    Film composition: $CH_{0.25}O_{0.03}N_{0.08}$
    Film thickness: 15 Å

DLC3
    The DLC3 film was formed by follow cathode method. The composition of the film was carbon only, and the thickness of the film was 20 Å.

The combination of the layers is shown in Table 1.

Comparative Example:

Formation of the Protective Film

For Comparison, sputtering of Si was conducted as the lower layer on the running surface of the thin-film magnetic head, until the thickness of 15–25 Å was obtained.

On the lower layer, the above-mentioned DLC1 film or DLC2 film was formed in the combination and with the thickness shown in Table 1.

The results are shown in Table 1. The values shown in the CSS column were the average numbers of defectives having reading failure (per 1000) after the start-stop action was repeated $100 \times 10^4$ times, the average being calculated from 100 times of tests.

The corrosion resistance was obtained using accelerated test, and the values in the column were the average numbers of defectives having reading failure (per 1000) after immersing the samples for 48 hours into purified water heated to 80° C., the average being calculated from 100 times of tests.

TABLE 1

| | Lower layer | | Upper layer (DLC) | | Overall thickness of Protective film (Å) | CSS Defective | Corrosion resistance Defective |
|---|---|---|---|---|---|---|---|
| | Sample | Film thickness (Å) | Sample | Film thickness (Å) | | | |
| Example | 1 | 5 | DLC1 | 25 | 30 | 1.1 | 0.9 |
| | 2 | 10 | DLC1 | 20 | 30 | 1.2 | 1.0 |
| | 3 | 15 | DLC2 | 15 | 30 | 1.1 | 0.8 |
| | 4 | 5 | DLC1 | 25 | 30 | 1.1 | 0.9 |
| | 5 | 10 | DLC1 | 20 | 30 | 1.2 | 0.9 |
| | 6 | 10 | DLC3 | 20 | 30 | 1.2 | 0.8 |
| | 7 | 15 | DLC2 | 15 | 30 | 1.1 | 1.0 |
| | 1 | 5 | DLC1 | 20 | 25 | 1.5 | 1.2 |
| | 2 | 10 | DLC2 | 10 | 20 | 1.8 | 1.4 |
| Comparative Example | Si sputter | 15 | DLC1 | 15 | 30 | 68 | 92 |
| | Si sputter | 25 | DLC2 | 25 | 50 | 9 | 13 |
| | 4 | 30 | | | 30 | 8 | 6 |
| | 4 | 70 | | | 70 | 3 | 2 |

[Effect of the Invention]

As is apparent from the results shown in Table 1, in the case of the Comparative Example in which the lower layer was formed by sputtering Si, the DLC thin film did not exhibit sufficient durability and corrosion resistance, even though the thickness of 25 Å was attained. The reason for this is believed that, as explained above, when Si is sputtered, a dense film cannot be formed and fine masses are easily formed. The lower layer used in the present invention alone did not exhibit sufficient durability and corrosion resistance when the thickness was below 70 Å. When the thickness was 40 Å or less, durability and corrosion resistance were remarkably lowered.

On the other hand, in the Example of the present invention, the above-mentioned lower layer of (A)(i) or (ii) was used, thereby remarkably improving durability and corro sion resistance. Even when the thickness is 40 Å or less, or even 30 Å or less, the film can be used as the protective film for the MR head. Since the distance between the head and the medium is remarkably reduced, the film is suitable for a recording medium having high-packing density.

What I claim is:

1. A thin-film magnetic head having an MR head portion containing magnetoresistive elements, wherein the following layers are formed on at least the surface of said MR head portion facing a recording medium:

(A) a lower layer composed of a thin film having a composition represented by the formula selected from the group consisting of:

formula (i) $SiC_XH_YO_ZN_WF_TB_UP_V$ where $X=0.5–26$, $Y=0.5–13$, $Z=0–6$, $W=0–6$, $T=0–6$, $U=0–1$ and $V=0–1$, in terms of atomic ratio, and formula (ii): $SiH_YO_ZN_WF_TB_UP_V$ where $Y=0.0001–0.7$, $Z=0–6$, $W=0–6$, $T=0–6$, $U=0–1$ and $V=0–1$, in terms of atomic ratio; and (B) an upper layer composed of a diamond-like thin film having a composition represented by the following formula: $CH_aO_bN_cF_dB_eP_f$ where $a=0–0.7$, $b=0–1$, $c=0–1$, $d=0–1$, $e=0–1$ and $f=0–1$, in terms of atomic ratio.

2. The magnetic head according to claim 1, wherein the overall thickness of said lower layer and said upper layer is 40 Å or less.

3. The magnetic head according to claim 1 or 2, wherein said lower layer and said upper layer are formed by vapor deposition method.

4. The magnetic head according to claim 1 or 2, wherein said lower layer has a thickness of 20 Å or less, and said upper layer has a thickness of 20 Å or less.

5. A magnetic disk device having at least one slider equipped with the thin-film magnetic head according to claim 1.

* * * * *